US009368795B2

(12) United States Patent
Izuhara et al.

(10) Patent No.: US 9,368,795 B2
(45) Date of Patent: Jun. 14, 2016

(54) LITHIUM SECONDARY BATTERY NEGATIVE ELECTRODE AND METHOD FOR MANUFACTURING THE SAME

(71) Applicants: Kouichi Izuhara, Nishikamo-gun (JP); Makoto Daifuku, Nishikamo-gun (JP); Yasushi Miyata, Nagoya (JP)

(72) Inventors: Kouichi Izuhara, Nishikamo-gun (JP); Makoto Daifuku, Nishikamo-gun (JP); Yasushi Miyata, Nagoya (JP)

(73) Assignees: SANGO CO., LTD., Miyoshi-shi (JP); CITY OF NAGOYA, Nagoya-shi (JP)

(*) Notice: Subject to any disclaimer, the term of this patent is extended or adjusted under 35 U.S.C. 154(b) by 207 days.

(21) Appl. No.: 14/240,190

(22) PCT Filed: Jun. 12, 2013

(86) PCT No.: PCT/JP2013/066275
§ 371 (c)(1),
(2) Date: Feb. 21, 2014

(87) PCT Pub. No.: WO2013/187452
PCT Pub. Date: Dec. 19, 2013

(65) Prior Publication Data
US 2014/0170490 A1 Jun. 19, 2014

(30) Foreign Application Priority Data

Jun. 13, 2012 (JP) ................. 2012-134317

(51) Int. Cl.
*H01M 4/583* (2010.01)
*H01M 4/134* (2010.01)
(Continued)

(52) U.S. Cl.
CPC .............. *H01M 4/583* (2013.01); *C23C 16/26* (2013.01); *C23C 16/5096* (2013.01);
(Continued)

(58) Field of Classification Search
CPC .. C23C 16/26; C23C 16/5096; C23C 16/513; H01M 4/0428; H01M 4/134; H01M 4/1395; H01M 4/362; H01M 4/386; H01M 4/583; H01M 4/625; H01M 4/661; Y02E 60/122; Y02P 70/54
See application file for complete search history.

(56) References Cited

U.S. PATENT DOCUMENTS

| 4,671,950 A | 6/1987 | Ogawa |
| 2003/0129305 A1 | 7/2003 | Wu |

(Continued)

FOREIGN PATENT DOCUMENTS

| CN | 101849302 A | 9/2010 |
| EP | 1897495 A1 | 3/2008 |

(Continued)

OTHER PUBLICATIONS

A. Yoshimura, et al.; "Synthesis of New Carbon Nano-Material by Plasma-Enhanced CVD and Structure Evaluation;" IHI Technology Review; vol. 48; No. 3; 2008-2009; pp. 176-181 (6 Sheets)/p. 6 of specification.

(Continued)

*Primary Examiner* — Scott J Chmielecki
(74) *Attorney, Agent, or Firm* — Kratz, Quintos & Hanson, LLP

(57) ABSTRACT

Provided is a negative electrode having a new structure for realizing a lithium secondary battery having increased charging/discharging capacities and a battery capacity that is reduced less due to repeated charging/discharging. The negative electrode for a lithium secondary battery includes a current collector substrate; a carbon nanochips layer including graphene sheets grown to incline in irregular directions independently from the current collector substrate; and a silicon thin film layer on the carbon nanochips layer, in which gaps among the carbon nanochips are formed between the silicon thin film layer and the current collector substrate. The Raman spectrum of graphite forming the carbon nanochips layer has a g/d ratio of 0.30 to 0.80, both inclusive, and the crystallinity level of the graphite is lower than that of graphite forming carbon nanowalls. The carbon nanochips layer can be formed by a plasma CVD method using a gaseous mixture of methane and hydrogen, for example.

10 Claims, 12 Drawing Sheets

(51) Int. Cl.

| | | |
|---|---|---|
| *H01M 4/1395* | (2010.01) | |
| *H01M 4/36* | (2006.01) | |
| *H01M 4/38* | (2006.01) | |
| *H01M 4/62* | (2006.01) | |
| *H01M 4/66* | (2006.01) | |
| *C23C 16/26* | (2006.01) | |
| *C23C 16/513* | (2006.01) | |
| *H01M 4/04* | (2006.01) | |
| *C23C 16/509* | (2006.01) | |

(52) U.S. Cl.
CPC .......... *C23C 16/513* (2013.01); *H01M 4/0428* (2013.01); *H01M 4/134* (2013.01); *H01M 4/1395* (2013.01); *H01M 4/362* (2013.01); *H01M 4/386* (2013.01); *H01M 4/625* (2013.01); *H01M 4/661* (2013.01); *Y02E 60/122* (2013.01); *Y02P 70/54* (2015.11)

(56) References Cited

U.S. PATENT DOCUMENTS

| | | | |
|---|---|---|---|
| 2003/0129497 A1 | 7/2003 | Yamamoto et al. | |
| 2004/0126659 A1 | 7/2004 | Graetz | |
| 2009/0004566 A1* | 1/2009 | Shirane | H01M 4/133 429/220 |
| 2009/0117466 A1 | 5/2009 | Zhamu et al. | |
| 2009/0117467 A1 | 5/2009 | Zhamu et al. | |
| 2009/0162750 A1* | 6/2009 | Kawakami | H01G 11/46 429/218.1 |
| 2009/0169725 A1 | 7/2009 | Zhamu et al. | |
| 2009/0169996 A1 | 7/2009 | Zhamu et al. | |
| 2009/0176159 A1 | 7/2009 | Zhamu et al. | |
| 2009/0186276 A1 | 7/2009 | Zhamu et al. | |
| 2009/0269511 A1 | 10/2009 | Zhamu et al. | |
| 2009/0305135 A1 | 12/2009 | Shi et al. | |
| 2011/0104551 A1* | 5/2011 | Yang | H01M 4/133 429/149 |
| 2011/0311874 A1* | 12/2011 | Zhou | C23C 14/185 429/231.8 |
| 2012/0270103 A1* | 10/2012 | Lee | H01M 4/131 429/211 |
| 2013/0045418 A1* | 2/2013 | Oguni | B82Y 30/00 429/211 |
| 2013/0156942 A1* | 6/2013 | Yamakaji | H01M 4/0404 427/126.6 |
| 2013/0209877 A1* | 8/2013 | Kren | H01M 4/139 429/211 |
| 2013/0295439 A1* | 11/2013 | Masarapu | H01M 4/485 429/163 |

FOREIGN PATENT DOCUMENTS

| | | |
|---|---|---|
| JP | 2003-77529 A1 | 3/2003 |
| JP | 2006-312577 A | 11/2006 |
| JP | 2006-312577 A1 | 11/2006 |
| JP | 2007-194204 A1 | 8/2007 |
| JP | 2008-63196 A1 | 3/2008 |
| JP | 2008-239357 A1 | 10/2008 |
| JP | 2009-521082 A1 | 5/2009 |
| JP | 2010-9980 A1 | 1/2010 |
| JP | 2011-503804 A1 | 1/2011 |
| JP | 2011-103256 A1 | 5/2011 |
| JP | 2013-65550 A1 | 4/2013 |
| TW | 561644 | 11/2003 |
| WO | WO 2005/021430 A1 | 3/2005 |
| WO | 2007071778 A1 | 6/2007 |
| WO | 2009009206 A2 | 1/2009 |
| WO | 2009033015 A1 | 3/2009 |
| WO | 2011137448 A3 | 11/2011 |
| WO | 2011146445 A3 | 11/2011 |
| WO | WO 2011/137448 A2 | 11/2011 |
| WO | WO 2012/020561 A1 | 2/2012 |

OTHER PUBLICATIONS

U. Kasavajjula, et al.; "Nano-and bulk-silicon-based insertion anodes for lithium-ion secondary cells;" Journal of Power Sources; vol. 163; 2007; pp. 1003-1039 (37 Sheets)/p. 7 of specification.

P.-Chiang Chen, et al.; "Hybrid Silicon-Carbon Nanstructured Composites as Superior Anodes for Lithium ion Batteries;" Nano Research; vol. 4; No. 3; 2011; pp. 290-296 (7 Sheets)/p. 7 of specification.

V. Krivchenko,et al.; "Carbon nanowalls decorated with silicon for lithium-ion batteries;" Carbon; vol. 50; 2012; pp. 1438-1442 (5 Sheets), Available online Oct. 29, 2011/p. 7 of specification.

International Search Report for International Application No. PCT/JP2013/066275 dated Sep. 10, 2013.

European Office Action, for the Corresponding EP Application No. 13805172.7, mailed on Mar. 31, 2015. 3.

N. Kitada, et al.; "Application of Carbon Nanowalls to Negative Electrode in Lithium-ion Secondary Battery"; Manufacturing Technology Association, Abstract Collections, [online] Nov. 13, 2008; Kanagawa Industrial Technology Center [searched on Jul. 16, 2009], URL: HYPERLINK https://www.kanagawa-iri.go.jp/kitri/kouhou/program/H20/pdf/3PS09.pdf; Date of Pub. Oct. 17, 2008. (p. 6 of specification).

Japanese Office Action, for the Corresponding JP Application No. 2013-556082, mailed on Mar. 10, 2015. (JP Application No. 2013-556082 is a counterpart to U.S. Appl. No. 14/240,190.)

Taiwanese Office Action, for the Corresponding TW Application No. 102138367, mailed on Dec. 27, 2014.

\* cited by examiner (A)

(B)

50nm

5nm

Nanobeam electron diffraction image Point A
Beam diameter : About 5nm φ

Nanobeam electron diffraction image Point B
Beam diameter : About 5nm φ

Selected area electron diffraction image Point C
Selected area region : About 600nm φ

Camera constant L・λ =20.06 Å・mm

LITHIUM SECONDARY BATTERY NEGATIVE ELECTRODE AND METHOD FOR MANUFACTURING THE SAME

TECHNICAL FIELD

The present invention relates to negative electrodes for lithium secondary batteries and a method for manufacturing the negative electrodes for lithium secondary batteries.

BACKGROUND ART

In recent years, mobile electronic devices such as mobile phones and notebook-sized personal computers have played an important role in the information society. The electronic devices need to be in a driving state over a long period of time, and high energy densities have been therefore required for secondary batteries used as driving power sources of the electronic devices.

In order to supply powers to the electronic devices and transporting systems such as vehicles, there is a need for high-performance lithium secondary batteries with reduced weights and increased energy densities. A lithium secondary battery has a configuration in which an electrolyte solution or a lithium solid electrolyte is sandwiched between a negative active material and a positive active material, the electrolyte solution being obtained by dissolving lithium salt into a non-aqueous solvent. Lithium ions are moving between the negative active material and the positive active material so that charging and discharging are performed.

While graphite has been used as the negative active material for lithium secondary batteries, it is not suitable for high-speed charging/discharging due to its large crystallite size (micron order). Carbon nanotubes are classified as a one-dimensional carbon nanostructure grown in one direction from a substrate surface by plasma CVD, for example. Further, carbon nanowalls (walls) are known, which are classified as a two-dimensional structure grown into the shape of a sheet in a vertical direction from a substrate surface (PTLs 1 to 4 and NPL 1).

A carbon nanowall (CNW) is a crystal with a relatively high crystal perfection level, formed of nano-sized graphite crystallites. Further, a carbon nanowall is a plate-shaped nanostructure formed of several to approximately 100 overlapping graphene sheets grown over a substrate surface with a graphite layer or an amorphous layer interposed in between, in a direction substantially vertical to the substrate surface. The graphene sheets are two-dimensionally extended to a total thickness of several nanometers to tens of nanometers.

While the height of a carbon nanowall increases to several hundred nm to one thousand and several hundred nm in proportion to the growth time, the thickness thereof stops increasing at approximately 40 nm. It is known that while growing carbon nanotubes (CNTs) requires a catalytic metal such as iron or cobalt on the substrate, growing carbon nanowalls does not particularly need a catalytic metal. As is further known, a carbon nanowall can be grown in a selective direction in which active species effective for the growth are falling down, when deposition is performed using a plasma CVD system under the conditions that the substrate temperature is roughly in the range of 400° C. to 500° C. and the pressure in a chamber is not higher than approximately 100 Pa.

Carbon nonowalls have received attention for its ideal structure as a negative electrode material capable of increasing high-speed charge/discharge characteristics of lithium secondary batteries (NPL 2 and PTLs 5 and 6). Carbon nanowalls are, however, disadvantageous in that the number of lithium atoms to be intercalated between layers is 1 in every 6 carbon atoms and the charging/discharging capacities theoretically have an upper limit of 372 mAh/g.

In the above circumstances, attention is currently focused on silicon, which is capable of obtaining more charging/discharging capacities than carbon negative electrode materials in theory, a silicon-based alloy, and a silicon oxide, for example. The reasons for this are that silicon can be used as a negative active material since it is alloyed with lithium, and that silicon can offer an increased battery capacity since it can incorporate more lithium than graphite can (see, for example, NPL 3 and PTLs 7 to 9).

While silicon is a material having a significantly larger capacity than carbons, silicon having been alloyed through absorption of lithium ions increases in volume approximately 4 times as much as the silicon before the absorption. Therefore, when silicon is used as the negative active material of a negative electrode, expansion and shrinkage repeatedly occur in the negative electrode in the charging/discharging cycle, and the negative active material is eventually destroyed mechanically. When silicon is used as the negative active material of a non-aqueous electrolyte secondary battery, the degradation of the negative active material due to the charging/discharging cycle is particularly notable and most of the battery capacity is lost after several sets of charging and discharging.

In order to deal with the above disadvantage, there has been developed a silicon-carbon composite nanostructured layer (NPL 4 and PTL 10) as a lithium battery negative electrode, in such a manner that a carbon nanostructured layer is formed by applying a slurry of carbon nanofibers or carbon nanotubes on a current collector conductive foil of copper, titanium, nickel, or etc. and sintering the slurry and a silicon sputtering layer with a thickness of 100 nm to 500 nm is formed on the carbon nanostructured layer. Further, another lithium battery negative electrode has been developed in which a film of nanoscale silicon particles is stacked on the surface of a carbon nanotube (PTL 11).

Furthermore, as shown in FIG. 20, a negative electrode material has been proposed (PTL 12 and NPL 5) with which a high capacity is achieved by arranging a negative active material 102 of silicon particles, a silicon coating, etc. so as to be supported by a wall in a vertical direction of a graphene sheet 101 of a carbon nanowall on a current collector substrate 100 and reducing change in volume of the negative active material 102 caused by charging and discharging in gaps among the graphene sheets 101.

PTL 12 discloses a configuration in which carbon nanowalls are formed to heights of approximately 5 μm to 20 μm by a plasma CVD system under the conditions that the respective flow rates of a carbonized source gas ($C_2F_6$) and a $H_2$ gas are 15 sccm and 30 sccm and the entire pressure in a chamber is 100 mTorr (13.3 Pa), each of the carbon nanowalls being in the shape of a wall and extending on a copper foil in a direction substantially vertical to the copper foil, and gaps between the walls are filled with negative active material particles or the surfaces of the walls are covered with films.

CITATION LIST

Patent Literatures

PTL 1: US 2003/0129305 A
PTL 2: Re-Publication WO 2005/021430
PTL 3: JP 2006-312577 A
PTL 4: JP 2008-239357 A PTL 5: JP 2008-063196 A
PTL 6: JP 2010-009980 A
PTL 7: JP 2003-077529 A
PTL 8: US 2004/0126659 A
PTL 9: JP 2007-194204 (U.S. Pat. No. 4,671,950)
PTL 10: US 2011/0311874A
PTL 11: JP 2009-521082 W
PTL 12: JP 2011-103256 A Non-Patent Literatures NPL 1: Akihiko Yoshimura, et al., "Synthesis of New Carbon Nano-Material by Plasma-Enhanced CVD and Structure Evaluation", IHI Technology Review, Vol. 48, No. 3, (2008-9), 176-181

NPL 2: Norio KITADA, "Application of Carbon Nanowalls to Negative Materials of Lithium Ion Secondary Batteries", 2008, Manufacturing Technology Association, Abstract Collections, [online], 2008 Nov. 13, Kanagawa Industrial Technology Center, [searched on Jul. 16, 2009] <URL: HYPERLNK https://www.kanagawa-iri.go.jp/kitri/kouhou/program/H20/pdf/3PS09,pdf, https://www.kanagawa-iri.go.jp/kitri/kouhou/program/H20/pdf/3PS09.pdf NPL 3: Uday Kasavajjula, et al., "Nano- and bulk-silicon-based insertion anodes for lithium-ion secondary cells", Journal of Power Sources, 163, (2007), 1003-1039

NPL 4: Po-Chiang Chen, et al., "Hybrid Silicon-Carbon Nanostructured Composites as Superior Anodes for Lithium Ion Batteries", Nano Research, 4, Num. 3, 290-296, (2011)

NPL 5: Victor A. Krivchenko, et al., "Carbon nanowalls decorated with silicon for lithium-ion batteries", CARBON, 50, (2012), 1422-1444, Available online, 29 Oct. 2011

SUMMARY OF INVENTION

Technical Problem

Silicon thin films and silicon alloy thin films are being expected to replace carbon as negative active materials of lithium ion secondary batteries. However, in a case of a multi-layered battery fabricated by sequentially laminating, on a current collector substrate, a silicon thin film as a negative active material, a solid electrolyte layer, and a positive active material layer, the thickness of the silicon thin film needs to be in the range of 2 μm to 3 μm, both inclusive, in order that a sufficient cycle life is ensured. If a silicon thin film having a thickness exceeding the above range is used, wrinkling or cracking generates in the silicon thin film due to volume expansion in repeated charging and discharging, and the silicon thin film is separated from the current collector substrate, whereby the capacity is reduced, resulting in degraded cycle characteristics. In order to deal with this problem, a negative electrode is being proposed having a silicon thin film with a thickness of not higher than 500 nm, although a high capacity is difficult to attain with the negative electrode.

However, as is the case with the negative electrode material disclosed in PTL 12 (see FIG. 17), in a structure which uses a wall of a wall-shaped carbon nanowall extending in a substantially vertical direction to a height of several μm to approximately 100 μm, increasing a charging capacity is limited since a negative active material 102 composed of Si particles or Si coatings, for example, needs to be adhered onto the wall in a manner such that gaps among graphene sheets 101 are not entirely filled in order that change in the volume of the negative active material 102 caused by charging and discharging is reduced in the gaps among the graphene sheets 101.

Further, as described in NPL 4 and PTL 10, in a negative electrode having a composite structure of a large number of free tangled carbon nanotubes and a silicon thin film, although the discharging capacity of the negative electrode is as large as 2528 mAh/g when a 300 nm-thick silicon thin film is sputtered, a uniform composite layer is difficult to form.

The present invention has been made in view of the above disadvantages of the existing techniques. An object of the present invention is to provide a negative electrode for a lithium secondary battery with a new negative electrode structure, which has large charging/discharging capacities and a battery capacity that is only slightly reduced due to repeated charging and discharging when a silicon-based negative active material is used.

Solution to Problem

The inventors of the present invention have discovered, in an in-depth study on carbon nanowalls, a flake-shaped carbon nanostructure (hereinafter referred to as a carbon nanochip when appropriate) having a form similar to a potato chip, unlike the shape of the existing carbon nanowalls, the structure including graphene sheets grown to incline in different directions with respect to a substrate. Note that an assembly of the carbon nanochips is referred to as carbon nanochips. Further, the inventors have found out that using the carbon nanochips as an underlying material and forming a negative active material layer on the carbon nanochips enable formation of a lithium secondary battery negative electrode having large charging/discharging capacities and a battery capacity which is only slightly reduced due to repeated charging and discharging. In this way, the inventors have achieved the present invention.

That is, a lithium secondary battery negative electrode according to the present invention includes: a current collector substrate; a carbon nanochips layer including graphene sheets, the graphene sheets being grown to incline in irregular directions independently from the current collector substrate; and a silicon thin film layer on the carbon nanochips layer, and gaps between carbon nanochips are formed between the silicon thin film layer and the current collector substrate.

In a Raman spectrum of graphite forming the carbon nanochips layer, a g/d ratio is in a range of 0.30 to 0.80, both inclusive, where g denotes a peak intensity of a g-band around 1600 $cm^{-1}$ resulting from oscillation in a hexagonal lattice of a carbon atom, d denotes a peak intensity of a d-band around 1360 $cm^{-1}$ representing a graphite defect, and d' denotes a peak intensity of a d'-band around 1630 $cm^{-1}$ representing a vertical orientation of the carbon nanochips layer.

The lithium secondary battery negative electrode according to the present invention can be manufactured by a method including the steps of: forming a carbon nanochips layer on a negative current collector by a plasma CVD method using a gaseous mixture of methane and hydrogen under conditions that a flow rate of $H_2/CH_4$ is in a range of 1/5 to 2/1, the temperature of a substrate is in a range of 650° C. to 850° C., a DC bias voltage is in a range of −200 V to 0 V, and a growth time is in a range of 15 minutes to 2 hours, the carbon nanochips layer including graphene sheets grown to incline in irregular directions independently from a substrate of the negative current collector; and forming a silicon thin film layer on the carbon nanochips layer.

Moreover, it is desirable that the method for manufacturing the lithium secondary battery negative electrode includes, prior to the step for performing the plasma CVD method, the step of activating the surface of the current collector substrate by generating plasma in a chamber under the presence of oxygen.

Since a silicon thin film layer grown by vapor phase growth has a concave-convex surface reflecting a concave-convex surface of the carbon nanochips layer, a desirable thickness of the silicon thin film layer cannot be directly defined. The thickness of the silicon thin film layer is, however, desirably in the range of approximately 20 nm to 500 nm, which is the thickness viewed with an electron microscope of a flat and smooth silicon thin film layer deposited on a flat and smooth surface of the substrate under the same conditions as those for depositing the silicon thin film on the carbon nanochips layer. The silicon thin film layer with a thickness of larger than 500 nm is undesirable in that the inner resistance of the battery and the degrees of expansion and shrinkage of the silicon volume caused by charging and discharging are disadvantageously large when the thickness is larger than 500 nm. On the other hand, the silicon thin film layer with a thickness of smaller than 20 nm is undesirable as well in that the battery capacity is disadvantageously small when the thickness is smaller than 20 nm, although the silicon thin film layer with a smaller thickness offers better cycle characteristics. The thickness of the silicon thin film layer is more preferably in the range of approximately 50 nm to 300 nm.

The carbon nanochips layer is only grown to a height of approximately 200 nm. While the reason for this is unclear, it is very probable that plasma inhibits nucleus formation at the top edge of the grown carbon nanochips layer in the plasma CVD method. When the carbon nanochips layer has a thickness of smaller than 20 nm, there is a difficulty in absorbing the expansion and shrinkage of the volume of the silicon thin film. The carbon nanochips layer functions sufficiently well when the thickness (height) thereof is as small as up to approximately 200 nm. The height (thickness) of the carbon nanochips layer is an average height of the thin film layer viewed with an electron microscope. An average height (thickness) from the current collector substrate surface to the silicon thin film surface is desirably in the range of approximately 40 nm to 600 nm.

According to the present invention, the silicon thin film is formed on a surface of the carbon nanochips layer which is exposed on the opposite side of the carbon nanochips layer from the current collector substrate surface, the layer including a large number of graphene sheets grown independently from the substrate surface of the negative current collector to incline in irregular directions. With this structure, even in a case where the volume of the silicon is changed to a large extent due to charging and discharging, the carbon nanochips bend toward the substrate surface and relax the stress, whereby the silicon thin film is prevented from being distorted and degraded. Further, a large number of gaps in the carbon nanochips are formed between the silicon thin film layer and the current collector substrate surface, and compression and recovery of the gaps make it possible to successfully response to expansion and shrinkage of the volume of the silicon thin film caused by the charging and discharging reactions. In this way, separation of the silicon thin film can be prevented by relaxing the stress generated from the expansion and shrinkage.

A Raman spectrum shows that graphene which forms carbon nanochips has a lower crystallinity level than known graphene which grows to extend vertically and forms carbon nanowalls. Further, an amorphous phase remains as it is in the graphene which forms carbon nanochips. When silicon is deposited on a graphene surface forming a carbon nanochip, SiC is formed through the reaction of the graphene and the silicon. A chemical action of the SiC and Li is much likely to contribute to a high capacity of the lithium secondary battery negative electrode according to the present invention.

Moreover, carbon nanochips have a lower crystallinity level and a large number of structural defects, and lithium ions intercalated into silicon particles of the silicon thin film layer pass through voids of wide wall surfaces of the carbon nanochips, crystal defects of contacting carbon nanochips at the top edge thereof, etc. and are eventually intercalated into the carbon nanochips. As a result, lithium ions are absorbed in a considerable amount into the negative electrode.

Advantageous Effects of Invention

According to the present invention, there is provided a lithium secondary battery negative electrode in which a theoretical electric capacity is much larger than the theoretical electric capacity when an existing carbon nanowall (CNW) or silicon thin film is used as an active material, charging/discharging capacities are large, and a battery capacity is only slightly reduced by repeated charging and discharging.

DESCRIPTION OF EMBODIMENTS

Figure 1:
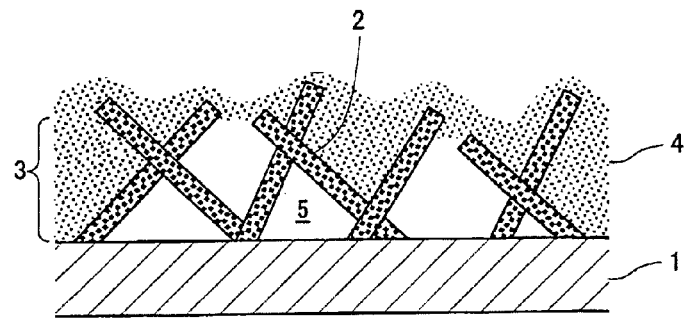
FIGS. 1A and 1B are cross-sectional schematic views of a lithium secondary battery negative electrode according to the present invention in a vertical direction with respect to a substrate surface (FIGS. 1A and 1B are views before and after charging, respectively).
Figure 1:
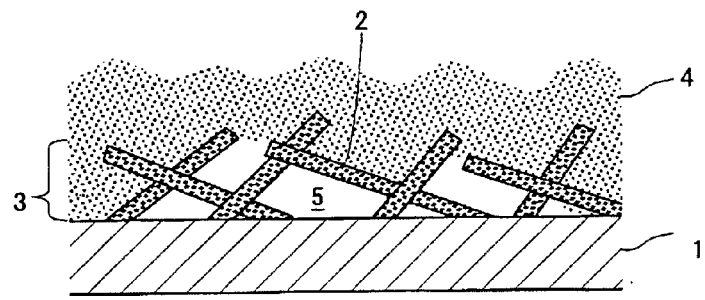
Figure 2:
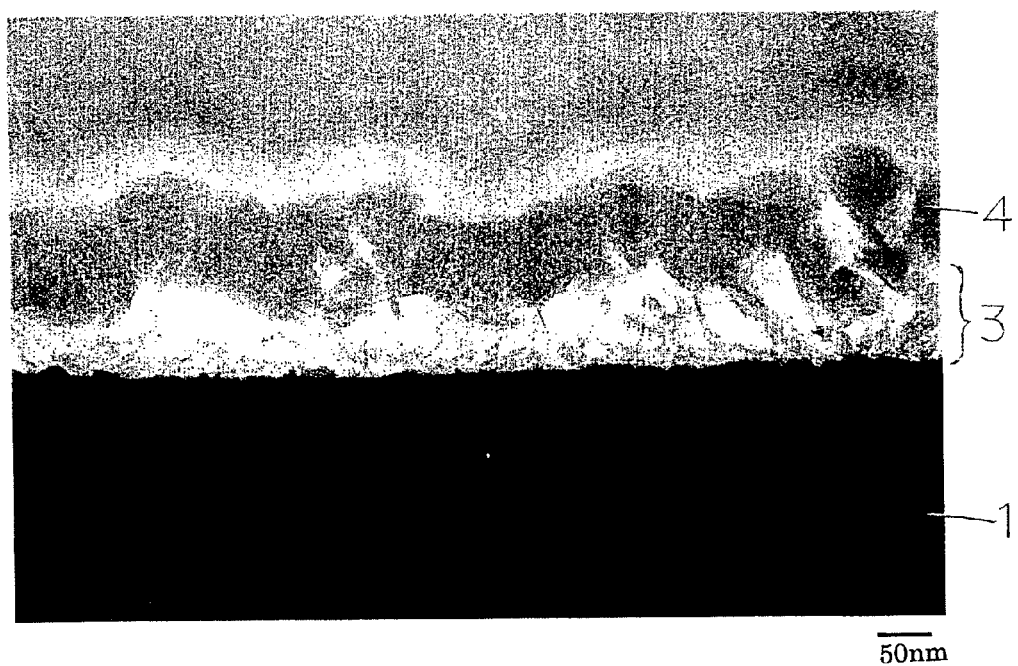
FIG. 2 is a diagram-replacing transmissive electron microscope photograph of the cross section of the lithium secondary battery negative electrode according to the present invention in the vertical direction with respect to the substrate surface.

In the lithium secondary battery negative electrode according to the present invention, graphene sheets 2 are grown to incline in different directions independently from the surface of a current collector substrate 1 so that a carbon nanochips layer 3 is formed, and a silicon thin film layer 4 is formed as a negative active material on the carbon nanochips layer 3 as an underlying layer, as shown in FIG. 1. In FIG. 1, the silicon thin film layer 4 has a concave-convex surface reflecting a concave-convex surface of carbon nanochips layer 3. FIG. 2 is a transmissive electron microscope photograph of the cross section of the negative electrode structure in a vertical direction with respect to the surface of the current collector substrate 1. On the black-looking stainless steel substrate 1, the white-looking carbon nanochips layer 3 and the gray-looking silicon thin film layer 4 are sequentially formed.

The silicon thin film may be formed of any materials as long as the materials are silicon-based materials such as a silicon alloy and a silicon oxide which are suitable for an active material.

The carbon nanochips are a large number of graphene sheets grown to incline in irregular directions with any part of the surface of the negative current collector substrate as a growth nucleus. Each of the graphene sheets is in the shape of a flake resembling a potato chip. The graphene sheets are in contact with each other or close to each other at a large area of the edges of the graphene sheets near the destination of the growth. Since carbon nanochips have a self-organizing function as with carbon nanowalls, a large number of carbon nanochips grow at intervals of several nm to dozens nm in the growth nucleus at the surface of the current collector substrate 1.

The experimental results that the present inventors have obtained show that the carbon nanochip formed of the graphene sheets having grown to incline in different directions has charging/discharging capacities much larger than a theoretical electric capacity (372 mAh/g) of the existing carbon nanowalls in which the number of lithium atoms to be intercalated between layers is 1 for every 6 carbon atoms. Moreover, the large charging capacity obtained by using the negative electrode according to the present invention probably results from generation of SiC caused by the reaction of Si and carbon nanochip and from a chemical action of Li and SiC.

The negative active material layer has a configuration in which the silicon thin film 4 is formed on a surface of the carbon nanochips layer 3 which is exposed on the opposite side of the carbon nanochips layer 3 from the surface of the current collector substrate 1. When the graphene sheets 2 are formed so as to be in contact with each other or close to each other at the edges thereof near the destination of the growth, the area of the silicon thin film which is blocked in a direction vertical with respect to the current collector surface is larger in forming the silicon thin film, compared to a case where the carbon nanowalls are formed vertically to extend from the substrate surface, and most of the silicon nanoparticles are deposited on the outer surfaces of the graphene sheets 2. Gaps 5 closed by the silicon thin film layer 4 are formed between the rear surface of the carbon nanochips layer 3 facing the upper surface of the negative current collector substrate 1 and the upper surface of the current collector substrate 1.

With this structure, if lithium ions reduced through charging enter the silicon thin film layer 4 as lithium to increase the volume, the gaps 5 formed by overlapping graphene sheets 2 as shown in FIG. 1(B) reduce increase in the volume of the silicon, whereby cracking or separation is prevented from occurring in the silicon thin film layer 4. Therefore, the lithium secondary battery negative electrode according to the present invention achieves large charging/discharging capacities and a battery capacity which is only slightly reduced due to repeated charging and discharging.

In the meanwhile, as the characteristics or structure of a carbon nanowall (CNW) in itself, a carbon nanowall has a wall-like structure independently standing in a nearly vertical direction from the surface of the substrate and having a thickness of several nm to dozens nm and a width and a height of several μm each, as described in PTLs 1 and 9 and NPLs 1 and 5. A CNW is formed of a laminate of several to approximately 100 graphene sheets and is in the form of a flat plate in which the surfaces of the graphene sheets and the surface of the CNW are parallel to each other. At the upper edge of the plate, the graphene sheets are exposed at their end sections. Since the growth starting point of a CNW combines with the substrate surface, the CNW is in an excellent conductive state with the current collector.

In the Raman spectrum of graphite of CNWs, there are a g-band peak, a d-band peak, and a d'-band peak, the g-band peak being around 1600 cm$^{-1}$ and resulting from oscillation in a hexagonal lattice of a carbon atom, the d-band peak being around 1360 cm$^{-1}$ and representing a graphite defect, and the d'-band peak being around 1630 cm$^{-1}$ and specific to CNWs when there are many edges of graphene. The larger the d-peak is, the larger the amount of impurities is. The intensity ratio g/d of the g-peak and d-peak is used as an indicator of the performance of graphite. Further, in CNWs, the value of g/d is correlated with the size of walls, and specifically, the smaller the g/d is, the larger the wall size is.

The graphene sheets forming the carbon nanochips layer capable of exhibiting large charging/discharging capacities as described above can be distinguished from graphene sheets forming carbon nanowalls by the Raman spectrum. Specifically, in the present invention, the graphene sheets forming the carbon nanochips can be distinguished because these graphene sheets are not grown in a vertical direction with respect to the substrate surface and the g/d ratio of the graphite is smaller than that of the graphite of typical nanowalls. Since a CNW is grown to a height of several μm, a carbon nanochip with a height of 200 nm or less is a CNW in the early stage of growth.

In the graphene sheets as grown forming the carbon nanochips layer used in the negative electrode according to the present invention, the g/d ratio and the g/d' ratio in the Raman spectrum are 0.30 to 0.80, both inclusive, where g denotes a peak intensity of the g-band around 1600 cm$^{-1}$ resulting from oscillation in a hexagonal lattice of a carbon atom, d denotes a peak intensity of the d-band around 1360 cm$^{-1}$ representing a graphite defect, and d' denotes a peak intensity of the d'-band around 1630 cm$^{-1}$ representing a vertical orientation of the carbon nanochips layer. More preferably, the g/d ratio and the g/d' ratio are in the range of 0.40 to 0.70, both inclusive. The g/d ratio depends to a large extent on the substrate temperature and the value of $H_2/CH_4$. Specifically, the higher and the larger the substrate temperature and the value of $H_2/CH_4$ are, respectively, the larger the g/d ratio is.

Figure 3:
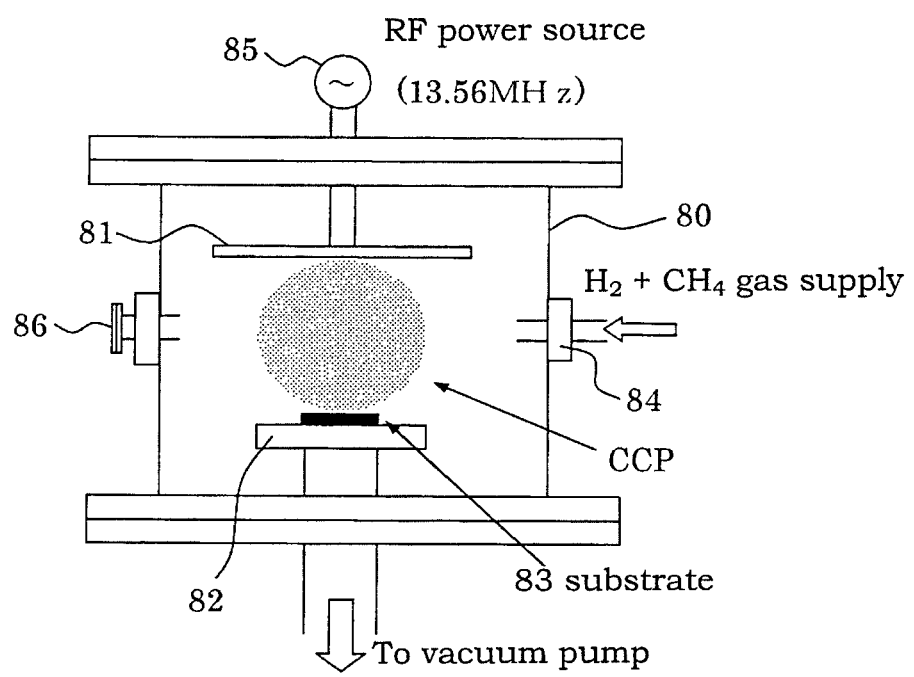
FIG. 3 is a cross-sectional view illustrating an embodiment of a plasma CVD system used for forming a carbon nanochips layer.

The carbon nanochips layer can be preferably formed by a plasma CVD method using a gaseous mixture of methane and hydrogen as a raw material. While the specification of the plasma CVD system is not particularly limited, a system using a parallel plate electrode needs to have a configuration in which a plate electrode including a first electrode 81 and a second electrode 82 is arranged in a vacuum chamber 80, of which air is exhausted by a vacuum pump, and a current collector substrate 83 is placed on the second electrode 82 in parallel to the plate electrode, as shown in FIG. 3. Further, a gaseous mixture of hydrogen and methane is flown between the plate electrodes from a gas inlet port 84 in parallel to the plate electrodes. An electric power is input into the first electrode 81 from a RF power source 85, the gaseous mixture is irradiated with an RF wave to become plasma, and a capacitively-coupled plasma atmosphere (CCP) is formed among the first electrode 81, the second electrode 82, and the current collector substrate 83. The temperature of the current collector substrate 83 is controlled by a heater (not shown in the drawings) in the second electrode 82. The vacuum chamber 80 may be provided with an observation window at a side thereof. The plasma CVD system is not limited to the one described above and may have another configuration in which a gaseous mixture is supplied from above the vacuum chamber, as described in PTLs 1 and 3.

It is preferable that prior to the formation of the carbon nanochips layer by a plasma CVD method, an oxygen cleaning step is performed in which the respective surfaces of the current collector substrate and the electrode for plasma CVD are cleaned with oxygen by generating plasma in the chamber under the presence of oxygen. When a stainless steel is used for the collector substrate, a passive coating film containing iron in the substrate surface can be activated and the carbon nanochips layer can be effectively formed.

The oxygen cleaning step is preferably performed in the conditions that the flow gas is oxygen, the gas flow rate is 60 sccm, the temperature of the current collector substrate is in the range of 60° C. to 200° C., the process pressures is 100 Pa, the time period is 1 hour, the applied high-frequency output is in the range of 100 W to 200 W, and the applied high frequency is 13.56 MHz.

In the plasma CVD method using the gaseous mixture of methane and hydrogen as a row material, an amorphous phase is be easily generated when the substrate temperature is set to be not lower than 650° C. in the growth conditions described later, and the carbon nanochips layer can be easily formed in which a large number of flake-shaped graphene sheets are grown in different directions, instead of in a vertical direction with respect to the substrate as is the case with known carbon nanowalls, while gaps are being formed among the graphene sheets.

The plasma CVD method herein is a method for performing chemical vapor-phase growth by generating plasma out of the raw material gas in order to activate a chemical reaction. The method conceptually includes high frequency plasma CVD using high frequencies, ECR plasma CVD applying a microwave and an ECR magnetic field, inductively-coupled plasma (ICP) CVD, UHF plasma CVD, VHF plasma CVD, etc, regardless of how the CVD methods perform excitation for plasma generation.

According to the present invention, the following is preferable conditions for the plasma CVD method. As a flowing gas, a gaseous mixture of hydrogen and methane is used. The mixture ratio $H_2/CH_4$ of hydrogen and methane is preferably in the range of 1/5 to 2/1 so that the carbon nanochips are grown independently from the substrate surface to incline in random directions. The smaller the ratio is, the larger the size of crystallites is and the smaller the g/d ratio is. Since the flow rate of the gaseous mixture depends on the system, an appropriate amount of the mixture needs to be selected according to the system. A flow rate of approximately 10 sccm to 500 sccm is generally desirable. The substrate temperature is desirably in the range of 650° C. to 850° C. The carbon nanochips are desirably grown for roughly 15 minutes to 2 hours under the conditions that the process pressure in the chamber is in the range of 0.05 Torr to 0.5 Torr (6.7 Pa to 66.7 Pa), the applied high-frequency output is in the range of approximately 50 W to 200 W, the applied high frequency is 13.56 MHz, and the distance from the electrode to the current collector substrate is in the range of approximately 20 mm to 30 mm.

For formation of the carbon nanochips layer, the substrate temperature needs to be not lower than 650° C., preferably higher than 700° C. and not higher than 850° C., and more preferably not higher than 800° C. A required growth time is 15 minutes or more. The height (growth) of the carbon nanochips layer can be controlled by the heating temperature of the substrate and the time of heating the substrate. Specifically, carbon nanochips can be grown to a height of approximately 200 nm in approximately 1 to 2 hours. Since the higher the process pressure in the chamber is, the more difficult it is to form the shape of nanochips, a process pressure of approximately 0.05 Torr to 0.1 Torr (6.7 Pa to 13.3 Pa) is more preferable.

Moreover, in the plasma CVD method, a bias voltage at the current collector substrate' side is desirably not larger than 0 V in terms of formation of the shape of the nanochips. The carbon nanochips layer is easily formed when the bias voltage is not larger than 0 V, and is more easily formed when the bias voltage is in the range of −100 V to 0 V.

Moreover, the shape, for example, of the carbon nanochips layer can be controlled by controlling the distance from the substrate to the electrode in implementing the method. Specifically, when a parallel plate electrode is used, the distance from the electrode to the current collector substrate is most preferably in the range of 20 mm to 30 mm. When the distance is not larger than 20 mm, the carbon nanochip is difficult to form and is in the form of a flat plate. On the other hand, when the distance is larger than 30 mm, the nanochip is in the form of micro particles or a flat plate.

The silicon thin film layer is preferably formed of gap silicon parts located in the gaps among the carbon nanochips and a silicon thin film layered part in the form of a layer over the carbon nanochips layer. The inventors of the present invention have found out that the carbon nanochips layer having the above structure reduces the change in the volume of the silicon as a negative active material caused by charging and discharging, so that separation or cracking is prevented from occurring.

The silicon thin film desirably includes amorphous silicon, microcrystalline silicon, or a combination of amorphous silicon and crystalline silicon. Further, as a method for depositing the silicon thin film layer, a vapor phase method is desirably used. While the method specifically includes a CVD method, a sputtering method, a vacuum deposition method, and a thermal spraying method, a vacuum deposition method is the most preferable. This is because when a vacuum deposition method is used for forming the silicon thin film layer, the kinetic energy of deposited silicon particles is smaller than that in the case of using a sputtering method, and gaps therefore generate more easily in the formed silicon thin film layer. Further, silicon parts in the gaps (the gap silicon parts) serve to reduce the change in the volume of the silicon as a negative active material caused by charging and discharging, so that separation or cracking can be prevented from occurring in the silicon thin film layer.

For example, when an electron beam vacuum deposition method is used, a thin film is formed on a substrate in such a manner that a heat-resistant container containing a silicon raw material and the substrate are arranged in a vacuum chamber to face each other, the vacuum degree of the chamber is set in the range of $10^{-3}$ Pa to $10^{-5}$ Pa, and the silicon raw material is irradiated with an electron beam emitted from an electron beam source in order that silicon is evaporated. The electron beam is accelerated at 4 kV to 8 kV. The raw material of silicon is heated, evaporated, and deposited on the substrate surface, so that a silicon thin film is formed on the carbon nanochips. The film thickness can be adjusted by the time for the deposition.

The silicon thin film, which has a concave-convex surface reflecting a concave-convex surface of the underlying carbon nanochips layer, is favorable when a solid electrolyte layer is formed on the silicon thin film, in that the contacting area of the silicon thin film and the solid electrolyte layer at the boundary therebetween can be increased. Alternatively, the silicon thin film can be smoothed by polishing the surface thereof.

Further, as the material of the current collector substrate, any material is applicable as long as the material is electrically conductive. Specifically, a current collector substrate made of any one of an austenitic stainless steel, a martensitic stainless steel, and a ferritic stainless steel is excellent in the corrosion resistance and achieves a low manufacturing cost. Although the carbon nanochips are grown without requiring a catalyst in the substrate surface, using a substrate made of an iron alloy or a stainless steel is favorable since the iron acts as a catalyst.

While the substrate temperature may exceed 900° C. in forming carbon nanochips by a plasma CVD method in a case where the negative current collector substrate is made of a stainless steel, the substrate temperature is preferably not higher than 850° C. since grain growth of graphite is caused by change of mode of graphite crystal growth when the temperature exceeds 900° C. Further, a carbon steel, copper, a copper alloy, silicon, a silicon alloy, nickel, a nickel alloy, titanium, or a titanium alloy, which has been generally used for current collector substrates, may be used. The practical thickness of the current collector is usually in the range of 100 nm to 300 nm.

Embodiments of the present invention will be hereinafter described with reference to drawings.

Embodiment 1

Negative Current Collector Substrate

A disc with a side of Ø16 mm is punched in a 1 mm-thick stainless steel (austenitic stainless steel SUS304) sheet and the sheet is used as a negative current collector substrate.

<Formation of Carbon Nanochips Layer>

Subsequently, the stainless steel sheet in which the disc has been punched is placed in a chamber of a plasma CVD system (see FIG. 3) and plasma CVD is performed in the following conditions. For comparison, plasma CVD is performed as well under the condition that the temperature of the current collector substrate is 600° C.

Figure 4:
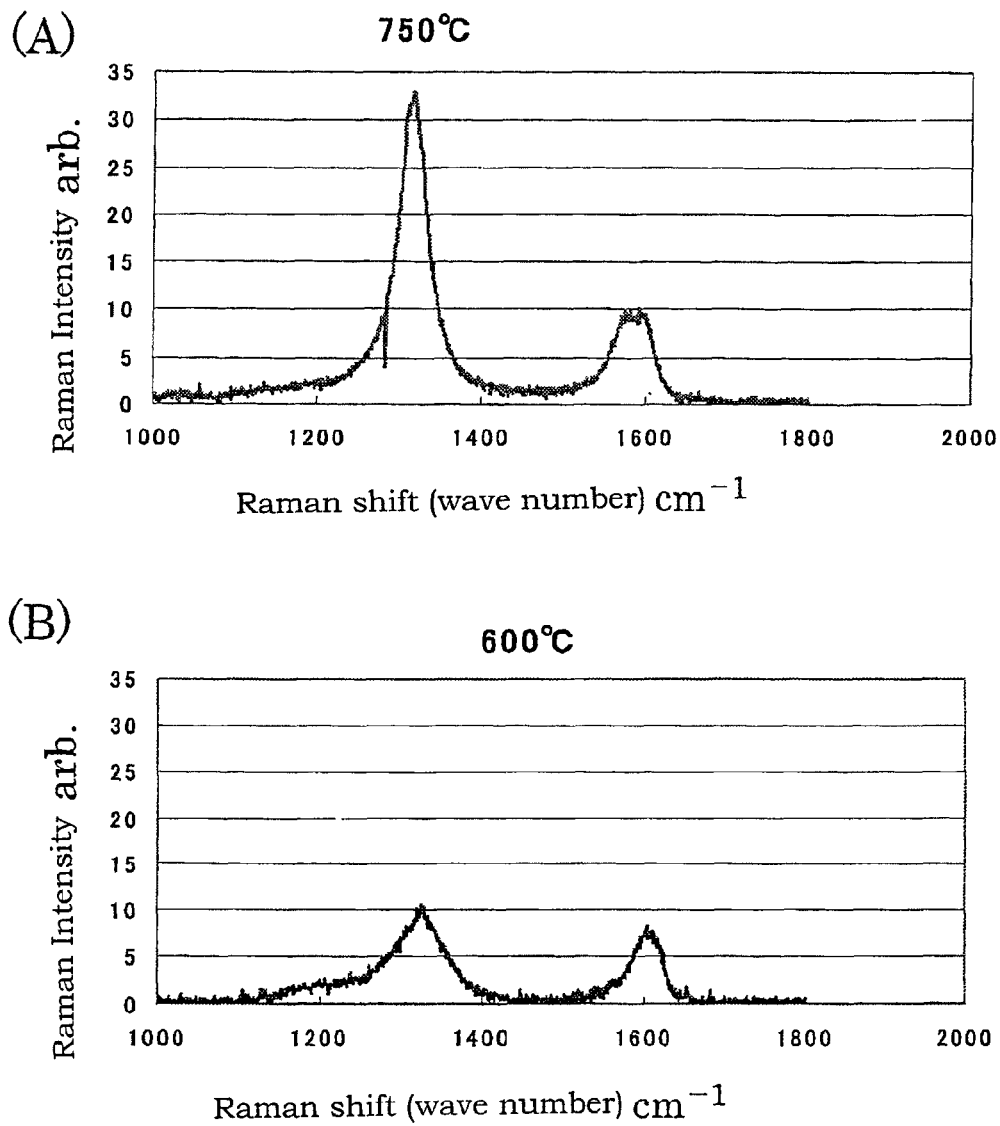
FIGS. 4A and 4B are charts of Raman spectra of graphite forming a carbon nanochips layer grown on an SUS304 stainless steel plate under the conditions that the temperatures of a substrate are 750° C. and 600° C., respectively.

Flow gas: a gaseous mixture of hydrogen (20% by volume) and methane (80% by volume)
Flow rate of gaseous mixture: 60 sccm
Temperature of current collector substrate: 750° C.
Process pressure: 0.1 Torr (13.3 Pa)
Time: 1 hour
DC bias voltage: 0 V
Applied high-frequency output: 100 W
Applied high frequency: 13.56 MHz
Distance from the electrode to the current collector substrate: 25 mm A chart of a Raman spectrum of the thus obtained sample and a scanning electron microscope photograph of a surface of the sample are shown in FIGS. 4 and 5, respectively.

For the sample (in FIG. 4A) grown under the condition that the temperature of the current collector substrate is 750° C., the d'-band, which is specific to carbon nanowalls, is clearly observed in the carbon nanochips in the chart of the Raman spectrum. However, for the sample (in FIG. 4B) grown under the condition that the temperature of the current collector substrate is 600° C., the d'-band is not observed and the carbon nanochips are not grown.

Figure 6:
FIG. 6 is a diagram-replacing transmissive electron microscope photograph of the carbon nanochips layer (TEM bright field image; ×240-thousand times).
Figure 7:
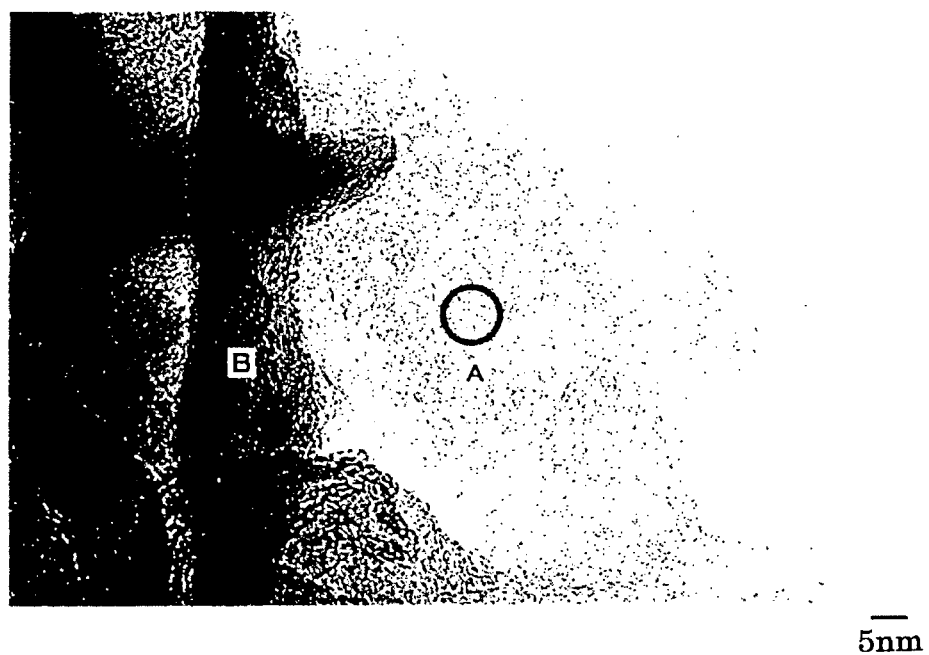
FIG. 7 is a diagram-replacing transmissive electron microscope photograph of the carbon nanochips layer (a part in a dotted square at the right-hand corner of FIG. 6; ×2-million times).
Figure 8:
FIG. 8 illustrates an electron beam diffraction image of the carbon nanochips layer observed through a transmissive electron microscope (in nanobeam electron diffraction images at points A and B in FIG. 7, the beam diameter is approximately 5 nmØ. In a selected area electron diffraction image at point C in FIG. 6, a selected area region is approximately 600 nmØ and a camera constant Lλ is 20.26 Å·mm).
Figure 8:
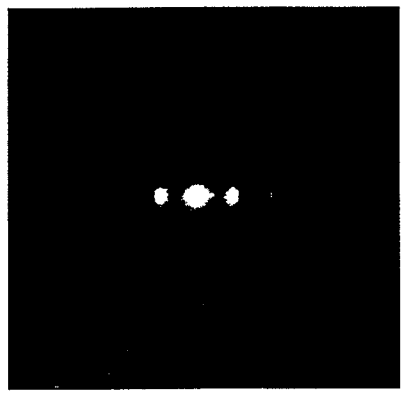
Figure 8:
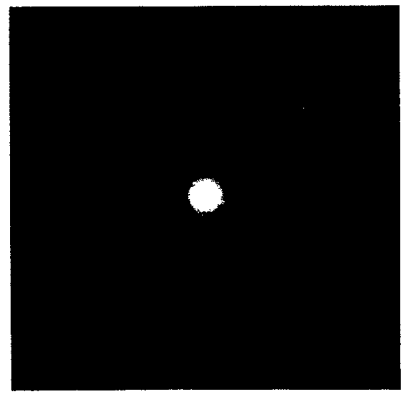

Moreover, the thus obtained transmissive electron microscope photographs (see FIGS. 6 and 7) and electron beam diffraction photograph (see FIG. 8) strongly suggest that graphene sheets are flake-shaped sheets grown in irregular directions, the carbon nanochips form significantly small crystals, and charging and discharging as the negative active material is rapidly performed.

Figure 5:
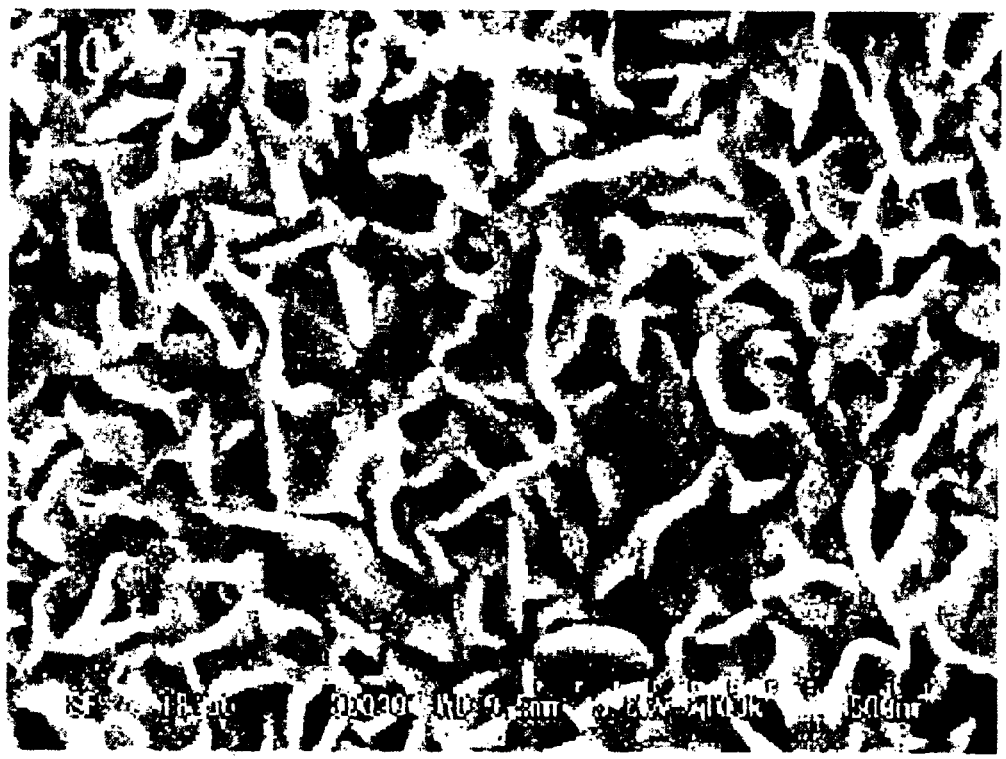
FIG. 5 is a diagram-replacing electron microscope photograph of the carbon nanochips layer grown on the SUS304 stainless steel plate, viewed from above the substrate surface.

In addition, the electron microscope photograph in FIG. 5 shows that although flat carbon crystals characteristic of carbon nanowalls are observed, the crystals are grown to incline in irregular directions independently from the current collector substrate, instead of being grown in a completely vertical direction to the current collector substrate as is the case with the crystals of generally known carbon nanowalls, and that the grown crystals are in contact with each other or close to each other near the destination of the growth.

<Formation of Silicon Thin Film Layer>

On the sample in which the carbon nanochips layer is formed on the SUS304 stainless steel substrate, silicon is vapor-deposited. In this way, a silicon thin film is formed. This vapor deposition is performed by irradiating a silicon target with an electron beam under an argon atmosphere, using an electron beam vapor deposition system. A lithium ion battery negative electrode is thus fabricated.

Figure 9:
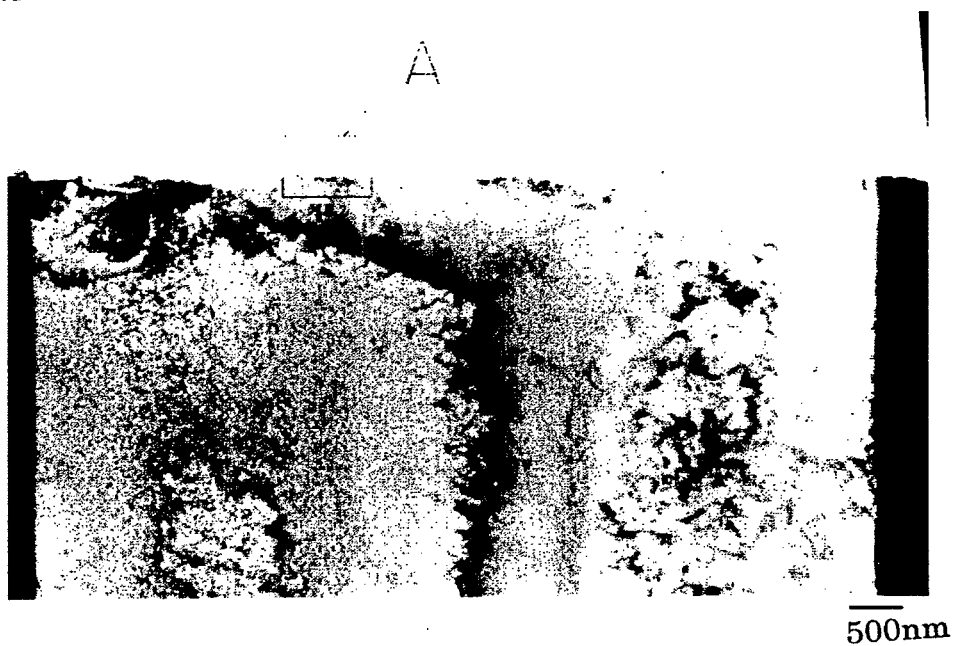
FIG. 9 is a diagram-replacing electron microscope photograph of a lithium secondary battery negative electrode according to Embodiment 1 (bright field image; ×30-thousand times).
Figure 10:
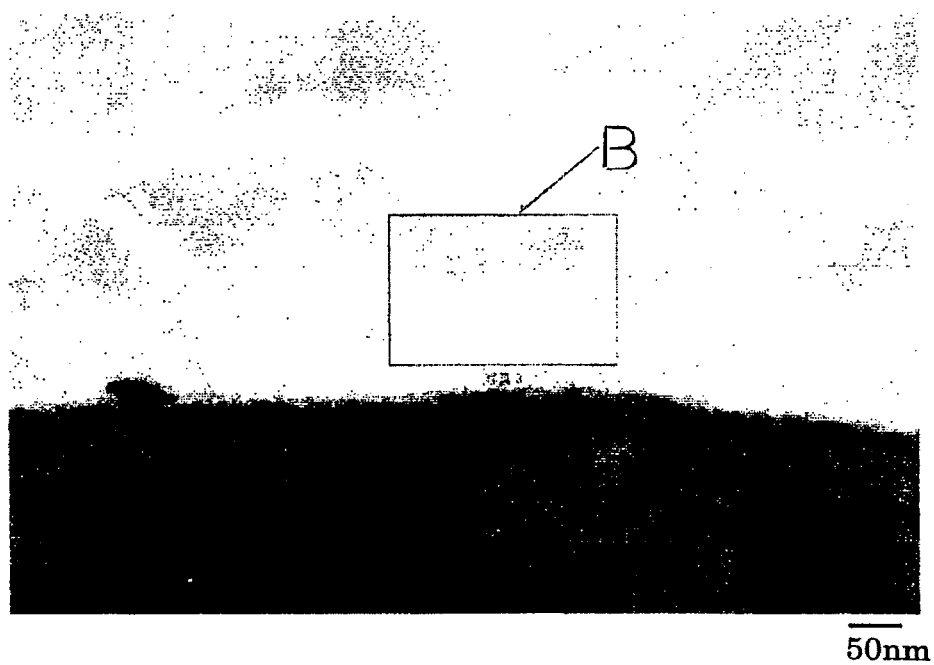
FIG. 10 is a diagram-replacing electron microscope photograph of the lithium secondary battery negative electrode according to Embodiment 1 (an enlarged image of a part A in FIG. 9; ×300-thousand times).
Figure 11:
FIG. 11 is a diagram-replacing electron microscope photograph of the lithium secondary battery negative electrode according to Embodiment 1 (an enlarged image of a part B in FIG. 10; ×1-million and 200-thousand times).

An electron microscope photograph of the lithium secondary battery negative electrode thus obtained is shown in each of FIGS. 9 to 11. FIG. 9 illustrates the stainless steel substrate in the gray part, and the carbon nanochips layer and the silicon thin film layer in the white part on the stainless steel substrate (Part A in FIG. 9). FIG. 10 illustrates a bright field image of the frame part A in FIG. 9 magnified three-hundred thousand times. FIG. 11 illustrates a bright field image of the boundary part between the carbon nanochips layer and the silicon thin film layer in the frame part B in FIG. 10, the boundary part being magnified 1.2 million times. The photographs show that the silicon thin film layer includes a sequence of silicon thin films formed like a layer on the carbon nanochips layer and that gaps among the carbon nanochips and the upper surface of the carbon nanochips layer are covered with the silicon thin film layered part. Moreover, the carbon nanochips layer and the silicon thin film layered part have thicknesses of approximately 50 nm and 200 nm, respectively.

<Evaluation>

The negative electrode fabricated as above and a counter electrode of lithium metal are used to form a Ø20 coin cell secondary battery (half cell; Ø20 coin cell), and the charge/discharge characteristics of the secondary battery are measured. An electrolyte solution includes ethylene carbonate and dimethyl carbonate in a volume ratio of 1:2, and an electrolyte includes lithium hexafluorophosphate in a concentration of 1 mol/L.

Figure 12:
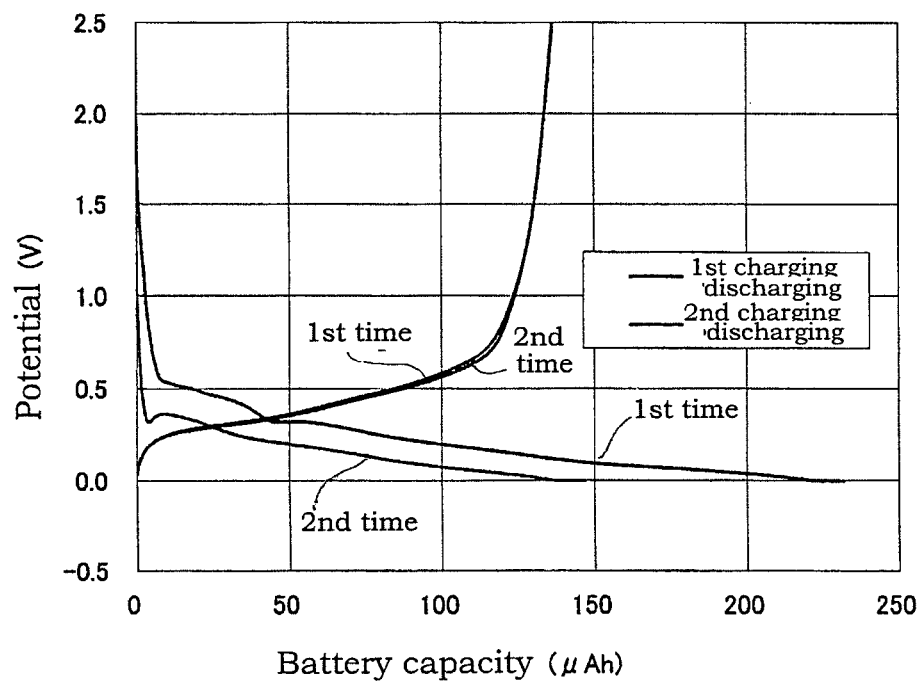
FIG. 12 is a graph illustrating the charge/discharge characteristics of a battery (half cell) using the lithium secondary battery negative electrode according to Embodiment 1.

As a charging/discharging test, charging and discharging are repeated at a charging/discharging rate of 20 µA. The capacities at the first and the second charging/discharging cycles are measured, and the measured values are defined as evaluations of the charge/discharge cycle characteristics. FIG. 12 illustrates a graph of charge/discharge characteristics. The charging/discharging capacities at the first cycle are 232 µAh and 147 µAh, respectively, and the charging/discharging capacities at the second cycle are 137 µAh and 136 µAh, respectively.

Figure 18:
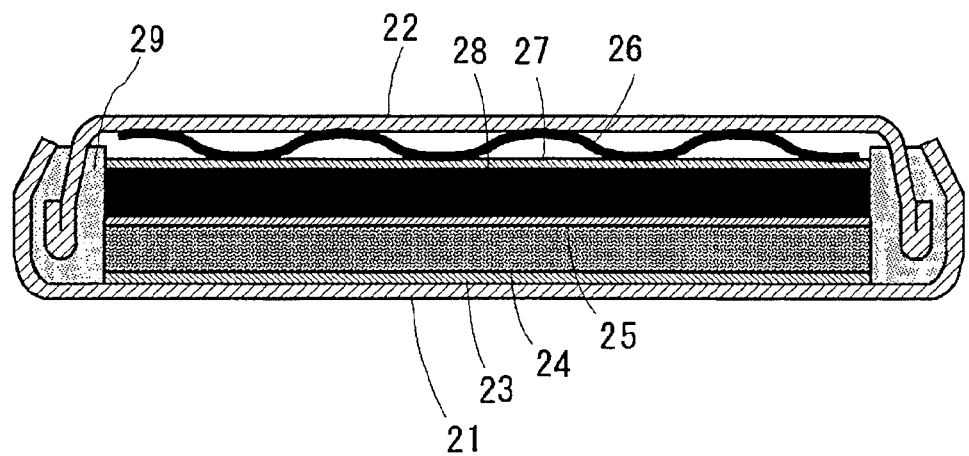
FIG. 18 is a cross-sectional schematic view of a general lithium secondary battery.

Further, the negative electrode fabricated as above is used to form a lithium secondary battery (full cell; Ø20 coin cell). Specifically, as shown in FIG. 18, a separator 25 is sandwiched between battery containers 21 and 22, a positive electrode 28 containing a positive active material ($Li_{1-x}CoO_2$ where x is 0 to 1) having a layered structure and a negative electrode 24 are arranged at both sides of the separator 25, respectively, an aluminum-based current collector 27 is brought into contact with the positive electrode 28 and is further brought into contact with the battery container 22 via a plate spring 26. In addition, a current collector 23 is brought into contact with the negative electrode 24 and the battery container 21. The battery containers 21 and 22 are engaged with each other by an insulating gasket 29. In the inside of each of the containers 21 and 22, an electrolyte solution for lithium ion batteries is added, which is obtained by preparing a mixture solution containing ethylene carbonate and dimethyl carbonate in a volume ratio of 1:2 and dissolving $LiPF_6$ in a concentration of 1 mol/L into the mixture solution.

Figure 13:
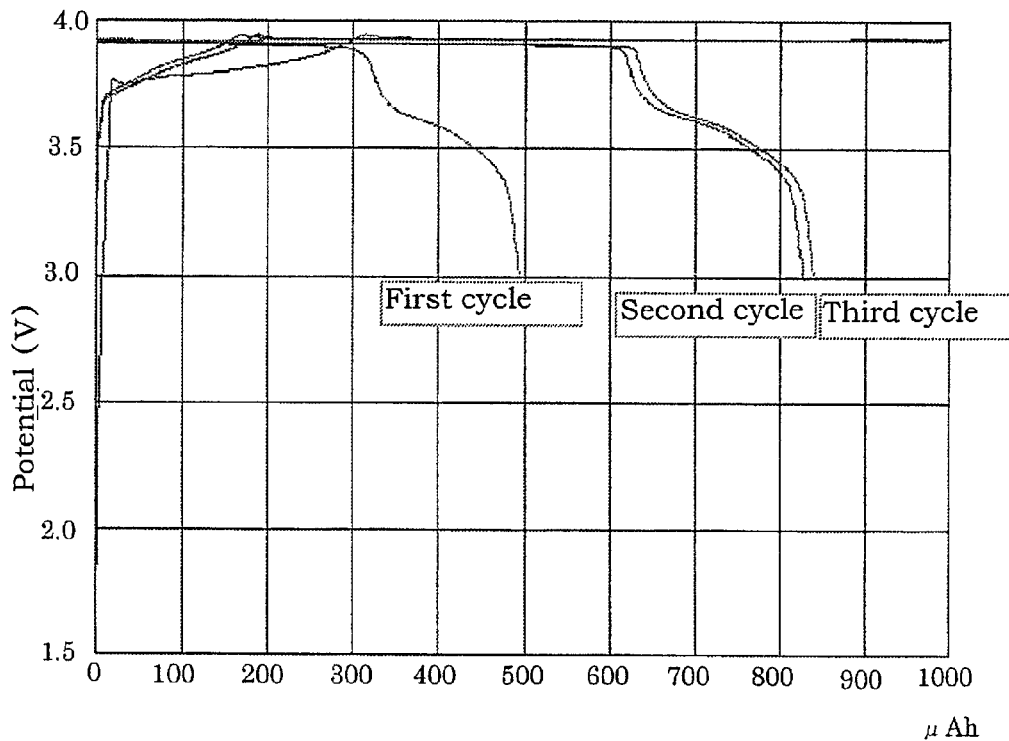
FIG. 13 is a graph illustrating the charge/discharge characteristics of a battery (full cell) using the lithium secondary battery negative electrode according to Embodiment 1.

FIG. 13 illustrates the charge/discharge characteristics of the thus fabricated lithium secondary battery. As a charging/discharging test, charging and discharging are repeated at a charging/discharging rate of 50 µA. The capacities at the first, the second, and the third charging/discharging cycles are measured, and the measured values are defines as evaluations of the charge/discharge cycle characteristics. The charging/discharging capacities at the first cycle are 999 µAh and 494 µAh, respectively, the charging/discharging capacities at the second cycle are 999 µAh and 828 µAh, respectively, and the charging/discharging capacities at the third cycle are 999 µAh and 839 µAh, respectively. The full cell of Embodiment 1 is a lithium secondary battery having large charging/discharging capacities and a battery capacity which is only slightly reduced due to repeated charging and discharging.

Embodiment 2

In Embodiment 2, an oxygen cleaning step is performed in which the respective surfaces of the current collector substrate and the plasma CVD electrode are cleaned with oxygen under the following conditions, prior to the step of forming the carbon nanochips layer by a plasma CVD method in Embodiment 1. The other steps in Embodiment 2 are similar to the steps in Embodiment 1 in which the carbon nanochips layer is formed by a plasma CVD method under the condition that the temperature of the substrate is 750° C., and the descriptions thereof will be omitted.

Flow gas: oxygen 100%
Flow rate of gas: 60 sccm
Temperature of current collector substrate: 80° C. at lowest, 180° C. at highest
Process pressure: 0.8 Torr (100 Pa)
Time: 1 hour
Applied high-frequency output: 100 W
Applied high frequency: 13.56 MHz Comparative Example 1

A generally known carbon nanowall is prepared in Comparative Example 1 under the same conditions as those in Embodiment 1, and is coated with a silicon thin film layer under the same conditions as those in Embodiment 1. The carbon nanowall is formed by introducing a $CF_4$ gas between parallel plate electrodes in a chamber of a CVD system and performing PECVD (plasma-enhanced chemical-vapor deposition) while heating the substrate to a temperature of approximately 500° C. The pressure in the chamber is 13.3 Pa and the time of growth is 8 hours. The other steps are similar to the steps in Embodiment 2 and the descriptions thereof will be omitted.

<Measurement of Raman Spectrum>

Figure 14:
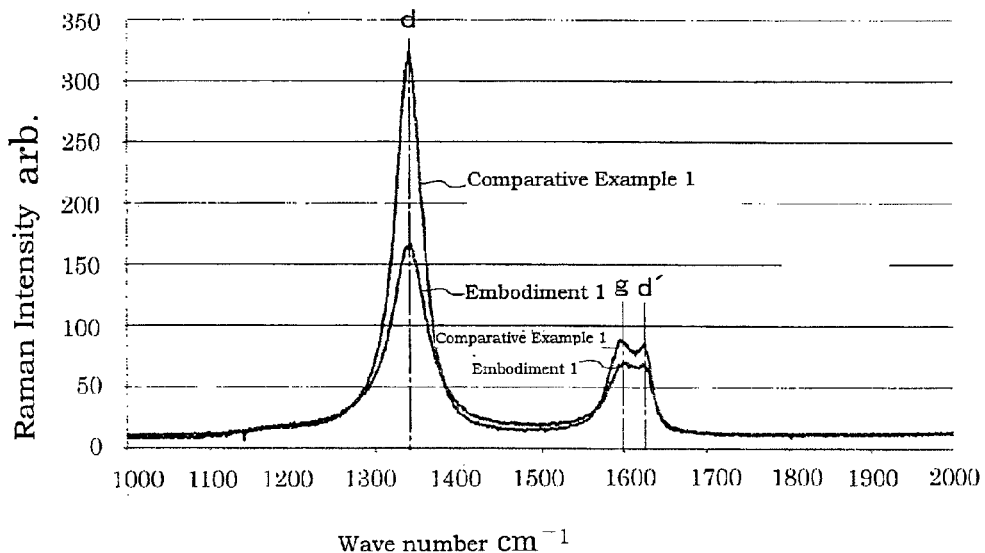
FIG. 14 illustrates Raman spectra of graphite of a carbon nanochips layer and graphite of a carbon nanowall layer before deposition of a silicon thin film layer of a lithium secondary battery negative electrode according to each of Embodiment 2 and Comparative Example 1.

A Raman spectrum is measured of graphite forming the carbon nanochips layer and the carbon nanowall layer before vapor deposition of the silicon thin film, the graphite being samples in the process of fabricating the lithium secondary battery negative electrode in Embodiment 2 and Comparative Example 1. The results are shown in FIG. 14. FIG. 14 indicates that the g/d ratio is 0.42 and 0.28 in Embodiment 2 and Comparative Example 1, respectively, which means that the crystallinity level of graphite is lower in Embodiment 2 than in Comparative Example 1.

<Evaluation>

Figure 15:
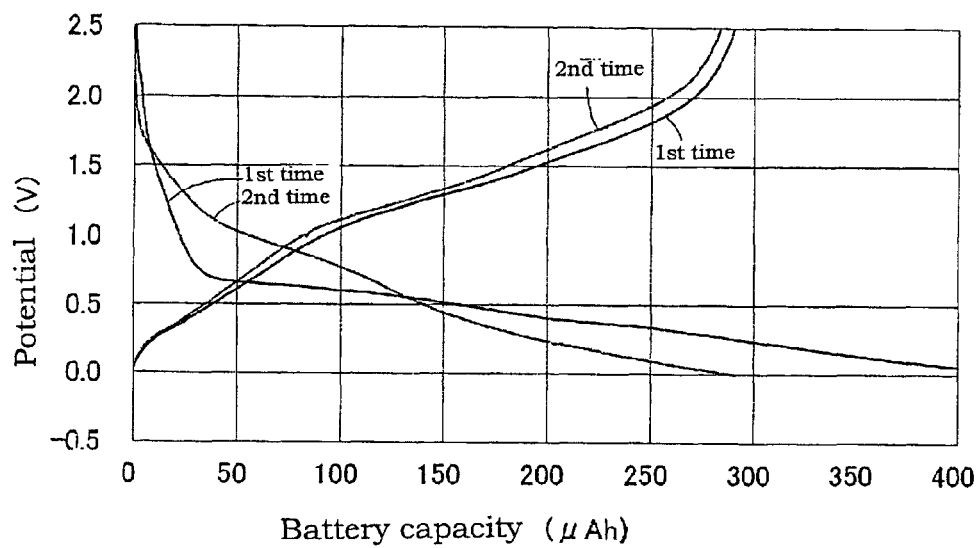
FIG. 15 is a graph illustrating the charge/discharge characteristics of a battery (half cell) using the lithium secondary battery negative electrode according to Embodiment 2.
Figure 16:
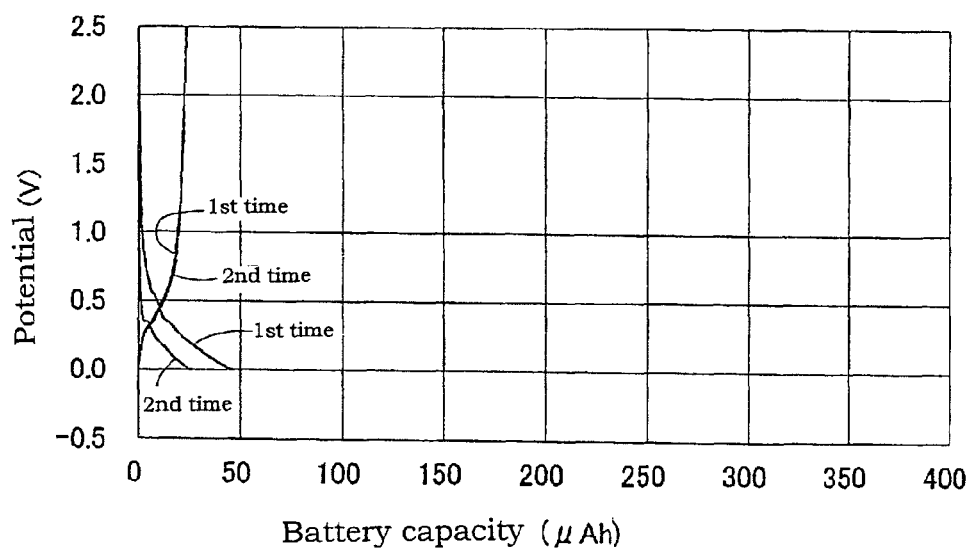
FIG. 16 is a graph illustrating the charge/discharge characteristics of a battery using the lithium secondary battery negative electrode according to Comparative Example 1.

The negative electrode prepared as above is used to fabricate a half cell in the same manner as that in Embodiment 1 and the charge/discharge characteristics are measured in the same manner as that in Embodiment 1. FIGS. 15 and 16 illustrate the charge/discharge characteristics of the half cell in Embodiment 2 and in Comparative Example 1, respectively. The graphs and the weight determined from an X-ray film thickness meter indicate that the charging/discharging capacities are much larger and the charging capacity is more excellent in Embodiment 2 than in Comparative Example 1. Further, it is found that charging and discharging can be repeatedly performed since no significant difference exists in the charge/discharge characteristics between in the first cycle and in the second cycle.

Figure 17:
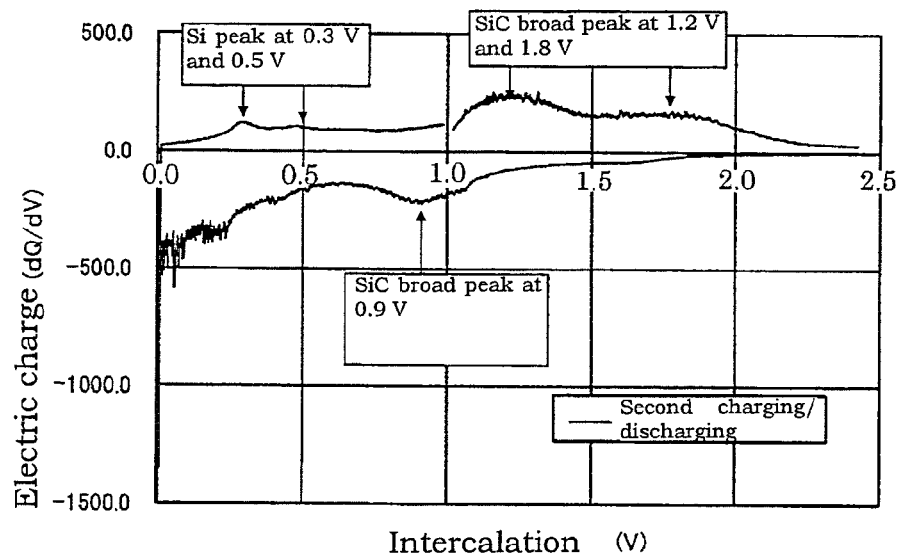
FIG. 17 is a graph of a differential curve representing the characteristics of the battery according to Embodiment 2 at the second charging/discharging.

Moreover, FIG. 17 illustrates a graph of a derivation curve representing the charge/discharge characteristics in the second cycle in Embodiment 2. This graph suggests generation of SiC. Specifically, broad peaks at 1.2 V and 1.8 V in a positive direction and a broad peak at 0.9 V in a negative direction are peaks associated with oxidation and reduction of SiC.

<Fabrication of Lithium Secondary Battery>

Figure 19:
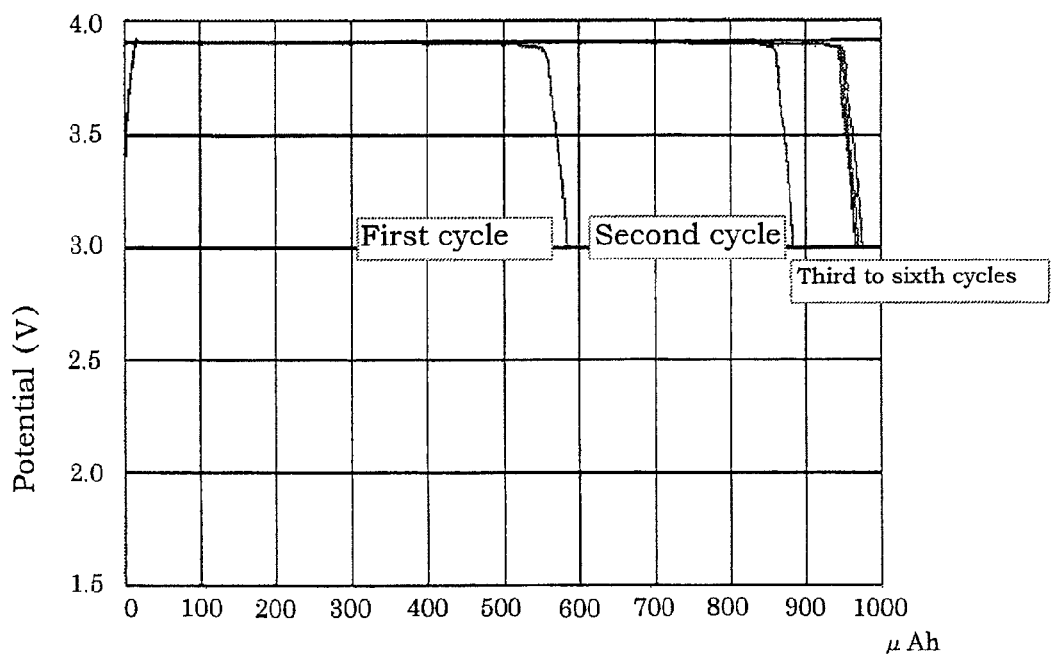
FIG. 19 is a graph illustrating the charge/discharge characteristics of a battery (full cell) using the lithium secondary battery negative electrode according to Embodiment 2.
Figure 20:
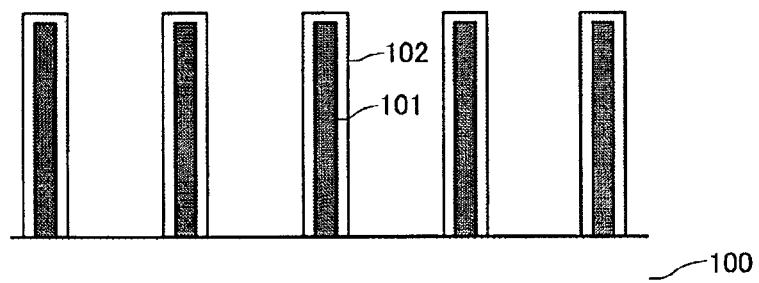
FIG. 20 is a cross-sectional schematic view of a negative electrode material described in PTL 12.

The negative electrode prepared as above is used to fabricate a lithium secondary battery (full cell) in the same manner as that in Embodiment 1 and the charge/discharge characteristics are measured. FIG. 19 illustrates the charge/discharge characteristics of the thus fabricated lithium secondary battery. The charging capacities in the first to sixth cycles are 1000 μAh, and the discharging capacities in the first to sixth cycles are 586 μAh, 833 μAh, 975 μAh, 965 μAh, 969 μAh, and 965 μAh, respectively. The full cell of Embodiment 2 is a lithium secondary battery having large charging/discharging capacities and a battery capacity which is only slightly reduced due to repeated charging and discharging.

While the present invention has been described with reference to the embodiments, it should be understood that the embodiments are only exemplary and various modifications are included in the present invention insofar as they are within the gist of the invention disclosed in the appended claims and within the range that those skilled in the art can easily anticipate.

INDUSTRIAL APPLICABILITY

The negative electrode of the present invention is expected to realize, at a low price, a high performance lithium secondary battery using silicon as a negative active material.

REFERENCE SIGNS LIST 1 current collector substrate
2 graphene sheet
3 carbon nanochips layer
4 silicon thin film layer
5 gap
21, 22 battery container
25 separator
28 positive electrode
24 negative electrode
23, 27 current collector
26 plate spring
29 gasket
80 vacuum chamber
81 first electrode
82 second electrode
83 current collector substrate
84 gas inlet port
85 RF power source
86 observation window
100 current collector substrate
101 graphene sheet
102 negative active material

The invention claimed is:

1. A lithium secondary battery negative electrode comprising:
   a current collector substrate;
   a carbon nanochips layer including graphene sheets, the graphene sheets being grown to incline in irregular directions independently from the current collector substrate; and
   a silicon thin film layer on the carbon nanochips layer, wherein
   gaps between carbon nanochips are formed between the silicon thin film layer and the current collector substrate.

2. The lithium secondary battery negative electrode according to claim 1, wherein
   in a Raman spectrum of graphite forming the carbon nanochips layer, a g/d ratio is in a range of 0.30 to 0.80, both inclusive, where g denotes a peak intensity of a g-band around 1600 $cm^{-1}$ resulting from oscillation in a hexagonal lattice of a carbon atom, d denotes a peak intensity of a d-band around 1360 $cm^{-1}$ representing a graphite defect, and d' denotes a peak intensity of a d'-band around 1630 $cm^{-1}$ representing a vertical orientation of the carbon nanochips layer.

3. The lithium secondary battery negative electrode according to claim 1, wherein the carbon nanochips layer is formed by a plasma CVD method using a gaseous mixture of methane and hydrogen as a raw material.

4. The lithium secondary battery negative electrode according to claim 1, wherein the silicon thin film layer has a concave-convex surface reflecting a concave-convex surface of the carbon nanochips layer.

5. The lithium secondary battery negative electrode according to claim 1, wherein the silicon thin film layer has a thickness of approximately 20 nm to 500 nm when is formed on a flat and smooth surface of the substrate.

6. The lithium secondary battery negative electrode according to claim 1, wherein the silicon thin film layer is formed by vacuum deposition.

7. The lithium secondary battery negative electrode according to claim 1, wherein the current collector substrate includes a carbon steel, a stainless steel, copper, a copper alloy, silicon, a silicon alloy, nickel, a nickel alloy, titanium, or a titanium alloy.

8. A lithium secondary battery using the lithium secondary battery negative electrode according to claim 1.

9. A method for manufacturing the lithium secondary battery negative electrode according to claim 1, comprising the steps of:
   forming a carbon nanochips layer on a negative current collector by a plasma CVD method using a gaseous mixture of methane and hydrogen under conditions that a flow rate of $H_2/CH_4$ is in a range of 1/5 to 2/1, the temperature of a substrate is in a range of 650° C. to 850° C., a DC bias voltage is in a range of −200 V to 0 V, and a growth time is in a range of 15 minutes to 2 hours, the carbon nanochips layer including graphene sheets grown to incline in irregular directions independently from a substrate of the negative current collector; and
   forming a silicon thin film layer on the carbon nanochips layer.

10. The method for manufacturing the lithium secondary battery negative electrode according to claim 9, further comprising a step of generating plasma in a chamber under the presence of oxygen and cleaning respective surfaces of the current collector substrate and a plasma CVD electrode with oxygen, prior to the step of performing the plasma CVD method.

* * * * *